United States Patent [19]
Melanson

[11] Patent Number: 5,896,101
[45] Date of Patent: Apr. 20, 1999

[54] WIDE DYNAMIC RANGE DELTA SIGMA A/D CONVERTER

[75] Inventor: John Laurence Melanson, Boulder, Colo.

[73] Assignee: AudioLogic Hearing Systems, L.P., Boulder, Colo.

[21] Appl. No.: 08/710,371

[22] Filed: Sep. 16, 1996

[51] Int. Cl.$^6$ ................................................. H03M 3/02
[52] U.S. Cl. ........................................ 341/143; 341/120
[58] Field of Search .................... 341/118, 120, 341/143

[56] References Cited

U.S. PATENT DOCUMENTS

| | | | |
|---|---|---|---|
| 4,943,807 | 7/1990 | Early et al. | 341/120 |
| 5,187,482 | 2/1993 | Tiemann et al. | 341/143 |
| 5,289,529 | 2/1994 | Karnowski | 379/88 |
| 5,392,042 | 2/1995 | Pellon | 341/143 |
| 5,461,381 | 10/1995 | Seaberg | 341/143 |
| 5,550,544 | 8/1996 | Sakiyama et al. | 341/155 |
| 5,583,501 | 12/1996 | Henrion | 341/118 |
| 5,594,612 | 1/1997 | Henrion | 341/120 |

OTHER PUBLICATIONS

"Multibit Oversampled $\Sigma$-$\Delta$ A/D Converter With Nonuniform Quantization, " by ??, Electronics Letters, 14 Mar. 1991, p. 528.

Digitally Corrected Multi-Bit $\Sigma\Delta$ Data Converters, by Cataltepe et al., IEEE Proc. ISCAS'89, pp. 647–650, May 1989.

*Primary Examiner*—Marc S. Hoff
*Attorney, Agent, or Firm*—Jennifer L. Bales; Macheledt Bales & Johnson LLP

[57] ABSTRACT

In a delta sigma modulator, generally comprising one or more integrators fed into a multilevel quantizer, the output of which is the output of the delta sigma modulator and is also fed through a digital to analog converter in a feedback loop to the integrators, the quantizer is made sparse, i.e. the levels output by the quantizer are not evenly spaced, but rather are closely spaced for small deviations from 0 V, and broadly spaced for large deviations from 0V. The A/D converter in the feedback is matched to the quantizer. For example, the levels might be −1 V, −1/8 V, 0V, 1/8 V, and 1 V. The digital output signal from the sparse quantizer is fed into a correction RAM, which corrects for nonlinearities in the D/A converter before the digital signal is filtered by a low pass filter and frequency down converted. The contents of the RAM are selected whenever the A/D conversion system is powered on. The contents of the RAM are selected by closing a series of sets switches in the A/D converter and adjusting the output of the RAM to 0.

17 Claims, 8 Drawing Sheets

5,896,101

WIDE DYNAMIC RANGE DELTA SIGMA A/D CONVERTER

BACKGROUND OF THE INVENTION

1. Field of the Invention

The present invention relates to analog to digital (A/D) data converters. More particularly, the present invention relates to wide dynamic range A/D converters.

2. Description of the Related Art

A digital signal processing type hearing aid must include an analog to digital (A/D) data converter, to turn the analog signal from the receiver into a digital signal prior to processing. Such an A/D converter must have low power requirements, and must also handle signals having a wide dynamic range. Speech signals might have dynamic ranges exceeding 80dB.

The preferred A/D converter for audio in general, and hearing aids in particular, is based upon a delta sigma modulator. Delta sigma modulation incorporates a noise-shaping technique whereby the noise of a quantizer operating at a frequency much greater than the bandwidth is moved to frequencies not of interest in the output signal. A filter after the quantizer removes the out of band noise. The resulting system synthesizes a high resolution data converter, but is constructed from low resolution building blocks. A good overview of the theory of delta sigma modulation is given in "Oversampling Delta-Sigma Data Converters," by Candy and Temes, *IEEE Press*, 1992.

A delta sigma modulator generally comprises one or more integrators for the input signal, which are fed into a quantizer, the output of which is the output of the delta sigma quantizer, and is also fed through a digital to analog converter in a feedback loop to the integrators. In the case of an A/D converter, the integrators are time sampled analog, usually switched capacitor, and the output is a digital bit stream to a decimation filter. In a delta sigma converter, there are three major factors which contribute to dynamic range, the order of the loop (the number of integrators), the number of levels of the quantizer, and the over sample ratio. In practice, delta sigma modulators are generally at least second order, because higher order modulators better reduce noise in the signal band, due to improved prediction of the in-band quantization error. Thus, the resulting signal to noise ratio is better. Second order delta sigma modulators are relatively stable, and easy to design. U.S. Pat. No. 5,392,042 describes how to build high order modulators for higher precision. U.S. Pat. No. 5,461,381 provides a good reference on implementation details of switched capacitor sigma delta converters.

Conventional, one bit, delta sigma converters must be clocked at around 2 MHz to achieve the desired wide dynamic range for audio signals. Such high clock speeds require more power than is desirable in a hearing aid. In order to achieve the desired dynamic range for a hearing aid at lower clock speeds, the quantizer in a conventional the delta sigma modulator could be given many levels. This means the quantizer would require many comparators, each of which dissipates power. More importantly, the digital to analog converter in the feedback loop must match the quantizer extremely accurately. This is not readily achieved without expensive techniques, such as trimming. Some of the error may be corrected by digital circuitry on the output of the delta sigma modulator.

Several other configurations have been proposed to improve the dynamic range of an A/D converter. For example, it has been proposed that the levels of the quantizer and the D/A converter in the feedback loop of the delta sigma modulator be exponentially spaced. As an example, the quantizer levels could be 1, 1.5, 1.5^2, 1.5^3, etc. This would achieve a nearly constant signal to noise ratio over a wide variation of input signals. The concept is not practical, as there is no practical way to build a exponential D/A that is also low power and fast. The accuracy demands on the D/A are severe.

A Swiss research company, Centre Suisse d'Electronique et de Microtechnique SA, has shown a "floating point" delta-sigma converter having several different ranges of gain, which switches between the gains as necessary to keep the signal in range. This is difficult to do accurately, as the states in the integrators must be modified when the switch takes place, and a separate circuit must monitor the converter for appropriate times to change gain.

Any converter can be preceded by an analog gain compressor. It is difficult to make this system track, and to achieve low distortion at low current. U.S. Pat. No. 5,289,529 uses an analog compressor before the a/d converter. It has proven difficult to reverse the compression by latter logic well enough to get a true result.

A need remains in the art for a low power A/D converter with sufficient signal to noise ratio and dynamic range at low power.

SUMMARY OF THE INVENTION

An object of the present invention is to provide a low power A/D converter with sufficient signal to noise ratio and dynamic range.

A delta sigma analog to digital (A/D) modulator has one or more integrators feeding a multilevel quantizer which provides an output signal and a feedback signal to a digital to analog (D/A) converter connected to the integrators. The multilevel quantizer is made sparse; i.e., the levels output by the quantizer are not evenly spaced, but rather are closely spaced for small deviations from 0, and broadly spaced for large deviations. Thus, for example, the multilevel quantizer provides at least four signal levels, including a small positive level, a big positive level, a small negative level and a big negative level. The small negative and small positive levels have approximately equal absolute values, and the big negative and big positive levels have approximately equal absolute values. The small positive level and said big positive level have a ratio between about 1:3 and 1:25.

The multilevel quantizer may further provide a signal level of approximately 0. Generally, the D/A converter in the feedback loop provides analog levels corresponding to the quantizer signal levels.

One effective configuration uses a multilevel quantizer where the small positive level, and the big positive level have a ratio of about 1:8. The A/1) modulator is especially useful as a component in a hearing aid.

As a feature, the multilevel quantizer further provides a very small positive signal level, and a very small negative signal level (nested levels). The very small negative and very small positive levels have approximately equal absolute values, and the very small positive level and the small positive level have a ratio between 1:3 and 1:25. Then the small positive level and the big positive level might have a ratio of about 1:8, and the very small positive level and the small positive level might also have a ratio of about 1:8.

As a feature, the digital output signal from a conventional quantizer or from the sparse quantizer described above is fed into a correction Random Access Memory (RAM), which corrects for nonlinearities in the D/A converter before the digital signal is filtered by a low pass filter and frequency down converted. The contents of the RAM are selected whenever the A/D conversion system is powered on. The contents of the RAM are selected by closing a series of sets of switches in the A/D converter and adjusting the output of the RAM to 0.

The method of calibrating the correction RAM includes providing a predetermined dc input signal to the A/D modulator, enabling only certain specified signal levels out of the multilevel quantizer, monitoring the output of the filter, adjusting the RAM value associated with at least one of the enabled quantizer signal levels until the output of the filter reaches a desired level, and iterating through the above steps with different specified signal levels for each iteration, until the correction RAM is adjusted for all but one of the quantizer signal levels.

The predetermined signal provided might represent a value of 0, and the multilevel quantizer may be the sparse quantizer described above. Then, the method of calibrating the correction RAM involves iterating through the steps four times, enabling various ones of the five signal levels for each iteration. For example, one of the following combinations of specified signal levels might be enabled for each iteration;

i. small positive and small negative,
ii. big positive and small negative,
iii. big negative and small positive,
iv. small positive, O, and small negative.

Thus, a delta sigma analog to digital (A/D) modulator with a multilevel quantizer includes a Random Access Memory (RAM) connected between the multilevel quantizer and the filter, and calibration circuitry for providing a predetermined input signal to the A/D modulator, iteratively enabling only certain signal levels out of the multilevel quantizer, monitoring the output of the filter, and iteratively adjusting the RAM until the output of the filter reaches a desired level for each iteration.

DETAILED DESCRIPTION OF THE PREFERRED EMBODIMENT

Figure 1:
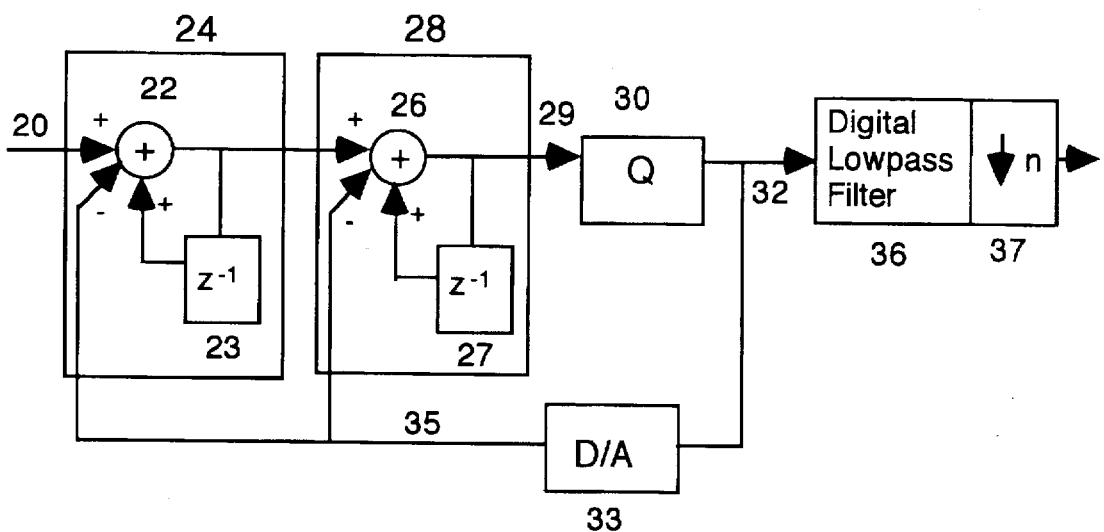
FIG. 1 (prior art) shows a second order delta sigma A/D converter having a multilevel quantizer.

FIG. 1 (prior art) shows a second order delta sigma A/D converter having a multilevel quantizer 30. Analog input signal 20 is added to feedback signal 35, as well as to the previous output of adder 22, delayed by delay 23. Adder 22 and delay 23 comprise integrator 24. The output of integrator 24 enters integrator 28, where it is added to the feedback signal 35 and the previous output of adder 26, delayed by delay 27. The output 29 is quantized by multilevel quantizer 30, forming the digital output signal 32, as well as the input signal to D/A converter 33. D/A converter 33 converts digital signal 32 into analog feedback signal 35, which is fed into integrators 24 and 28.

Digital output signal 32 is filtered by low p ass filter 36 to remove the out of band noise from quantizer 30. Decimator 37 then outputs a signal at an appropriate sample rate for the system. The ratio between the sample rate of the integrators and the output sample rate is called the oversample ratio, or OSR. The OSR will typically be from 32 to 256.

Analog integrators 24 and 28 are typically built in integrated circuits as switched capacitor logic, see Dandy and Temes.

In order to achieve the desired dynamic range at a low sample rate, such as 300 kHz, multilevel quantizer 30 might need as many as 17 levels. This means quantizer 30 would require 16 comparators, each of which dissipates power, as well as loading integrator 28. More importantly, D/A converter 33 must match quantizer 30 extremely accurately. In order to achieve a fifteen bit accurate output, a four bit comparator with fifteen bit accuracy is required in D/A converter 33. This is not readily achieved without expensive techniques such as trimming.

Figure 2:
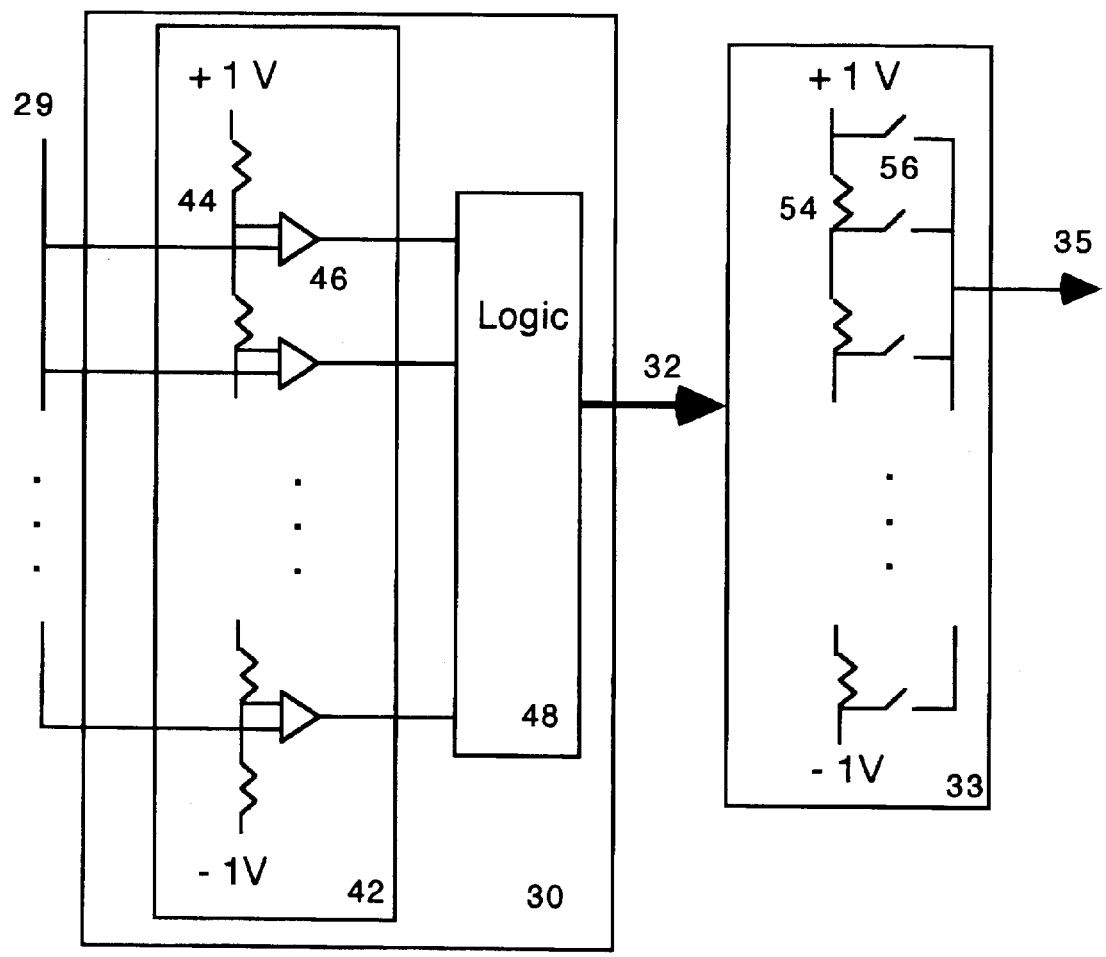
FIG. 2 (prior art) shows a circuit for implementing a conventional multilevel quantizer, and an accompanying matched D/A converter.

FIG. 2 (prior art) shows a conventional quantizer 30 and D/A circuitry 33 for use within an A/D converter such as that shown in FIG. 1. Quantizer 30 of FIG. 1 comprises comparator circuit 42 and logic block 48. Input signal 29 is fed into a chain of comparators 46 connected to a chain of resistors 44 for dividing the voltage; for example, −1 V to +1 V. Generally, the resistors 44 divide the voltage equally. Thus, in a system of 16 comparators 46 and 17 resistors 44, the top and bottom resistors 44 have resistance equal to $\frac{1}{32}$ R, and all of the intermediate resistors have resistance equal to $\frac{1}{16}$ R, where R is the total resistance of all of the resistors 44. Thus, the voltage between each adjacent pair of resistors 44 is fed to one of the inputs of the associated comparator. The voltage increases in equal steps between −1 V to +1 V ($-\frac{15}{16}$ V into the bottom comparator, $-\frac{13}{16}$ V into the next comparator, up to $+\frac{15}{16}$ V into the top comparator). This type of A/D converter is known as a flash converter. U.S. Pat. No. 5,402,128 describes a possible structure for a multi bit flash A/D converter.

Input signal 29 is fed into the other input of each comparator 46. Thus, if signal 29 has a voltage lower than $-\frac{15}{16}$ V, none of the comparators is on. If the voltage is above $-\frac{15}{16}$ V but less than $-\frac{13}{16}$ V one comparator, the bottom one, is on. If the voltage is 0 V, eight of the comparators are on. If the voltage is over $\frac{15}{16}$ V, all of the comparators are on. Logic block 48 determines which comparators 46 are on, and generates a digital signal 32 which represents the voltage of input signal 29.

D/A converter 33 comprises a chain of switches 56 connected to a chain of resistors 54. The switches are operated by logic block 48, which selects which switch to throw depending upon what output voltage is required. Thus, if −1 V is desired, the bottom switch is closed, and if 0 V is desired, the middle switch is closed. Closing the switch one above the middle results in a voltage of $\frac{1}{8}$ V, given 17 evenly spaced levels between −1 V and 1 V. The desired voltage appears on line 35, which is the feedback to integrators 24 and 28. As an alternative, the D/A converter will often be implemented with matched capacitors, which can be made more accurately than resistors in many integrated circuit processes.

Figure 3:
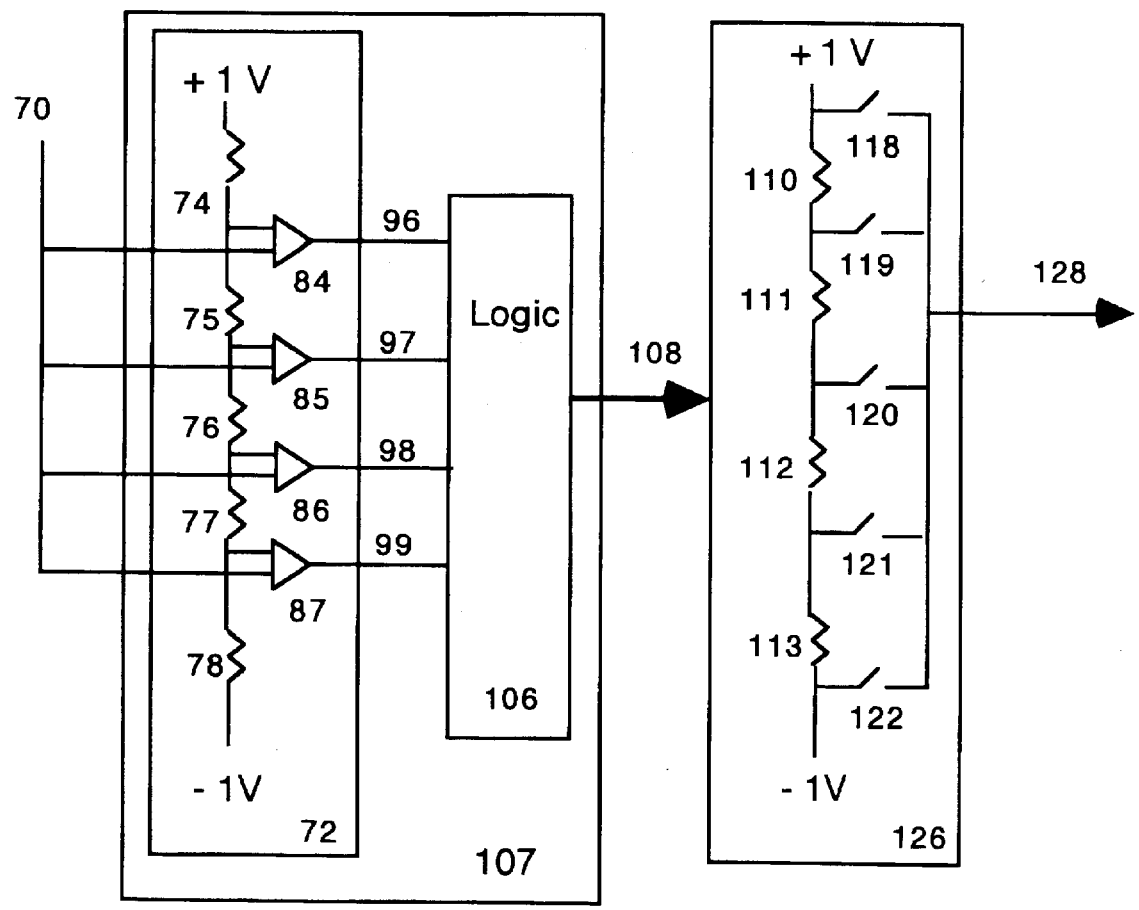
FIG. 3 shows a sparse multilevel quantizer in accordance with he present invention, and an accompanying matched D/A converter.
Figure 5:
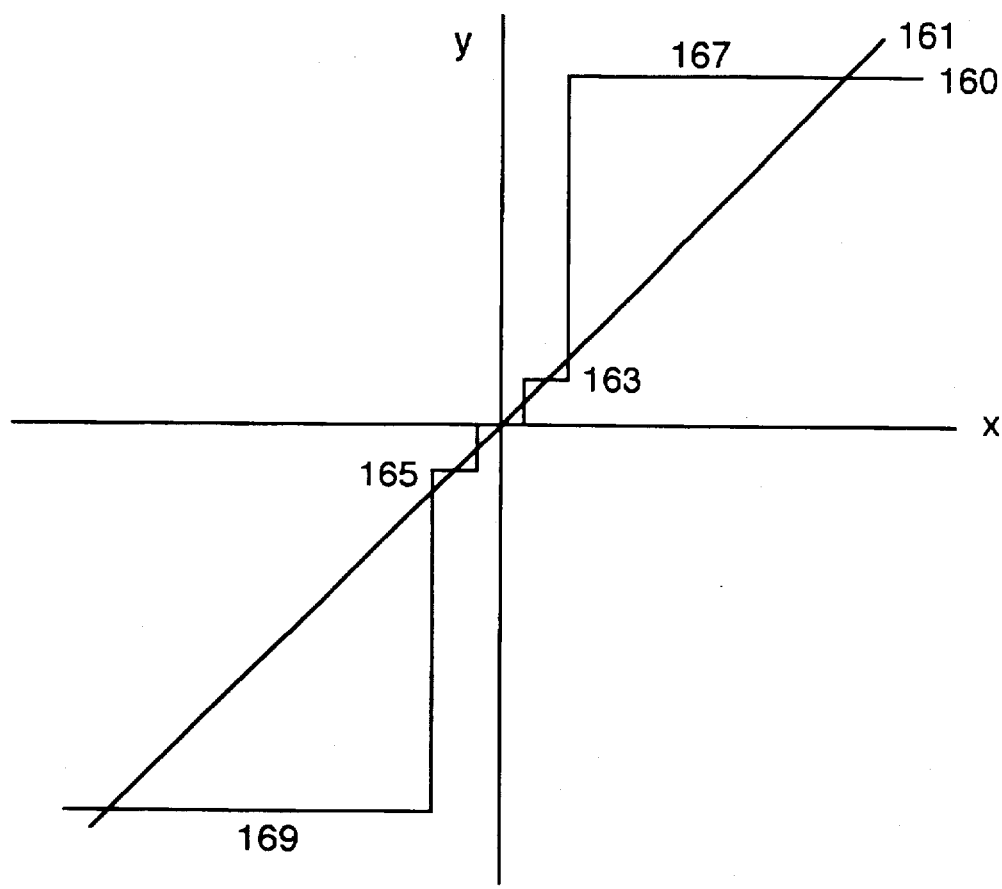
FIG. 5 shows the transfer function of the sparse quantizer of FIG. 3.

FIG. 3 shows a sparse multilevel quantizer 72 in accordance with the present invention, and an accompanying matched D/A converter 126. This circuitry is an improvement upon the prior art circuitry shown in FIG. 2. In the circuit of FIG. 1, quantizer 107 would replace conventional quantizer 30, and D/A converter 126 would replace conventional D/A converter 33. The most important improvement in the circuitry of FIG. 3 is that the quantizer is made sparse; i.e,. the levels output by quantizer 72 are not evenly spaced, but rather are closely spaced for small deviations from 0 V, and broadly spaced for large deviations from 0V. In the specific example of FIG. 3, the output levels from the D/A are as shown in FIG. 5; i.e., −1 V, −⅛ V, 0V, ⅛ V, and 1 V. The corresponding comparator input level cutoffs are −9/16 V, −1/16 V, 1/16 V, and 9/16 V.

This is accomplished by setting the values of the resistors as follows, where R is the total resistance of all of resistors 74–78. Resistors 74 and 78 have resistance equal to 7/32 R. Resistors 75 and 77 have resistance equal to 8/32 R. Resistor 76 has resistance equal to 2/32 R. Logic block 106 determines which comparators 84–87 are on, and generates a digital signal 108 which represents the voltage of input signal 70.

D/A converter 126 is very similar to D/A converter 33 of FIG. 2, comprising a chain of switches 118–122 connected to a chain of resistors 110–113. The switches are operated by logic block 106. Thus, if −1 V is desired, switch 122 is closed, and if 0 V is desired, switch 118 is closed. The desired voltage appears on line 128, which is the feedback to integrators 24 and 28. D/A converter 126 is designed to match quantizer 107, in that the available voltages are −1 V, −⅛ V, 0V, ⅛ V, and 1 V. Thus, resistors 110–113 have the following values, where R is the total resistance of all of the resistors. Resistors 110 and 113 have resistance equal to 7/16. Resistors 111 and 112 have resistance equal to 1/16.

Those skilled in the art will appreciate that a nested sparse quantizer, having levels of, for example, −1,−⅛, −1/64, 0, 1/64, ⅛, and 1 is simply a matter of adding two more appropriately scaled resistors and comparators to quantizer 72. Logic 106 would incorporate the output of the additional comparator in generating signal 32. The associated D/A converter would merely require the addition of two more appropriately scaled resistors and associated switches to D/A converter 126. The addition of the nested levels results in even wider dynamic range at the cost of a very small increase in power.

Delta sigma converters can be implemented using resistor chains, as shown in these figures, or by several other techniques. Capacitors can be switched, and the charge on those capacitors integrated, instead of using the voltages on resistors. Candy and Temes describes typical circuits for the switched capacitor mode. Some designers have used switched currents. Any of these circuits can be built in balanced mode, which is known to increase performance and make it easier to match levels such as the −⅛ and +⅛. A good discussion of a balanced switched capacitor design is given in U.S. Pat. No. 5,461,381.

Figure 4:
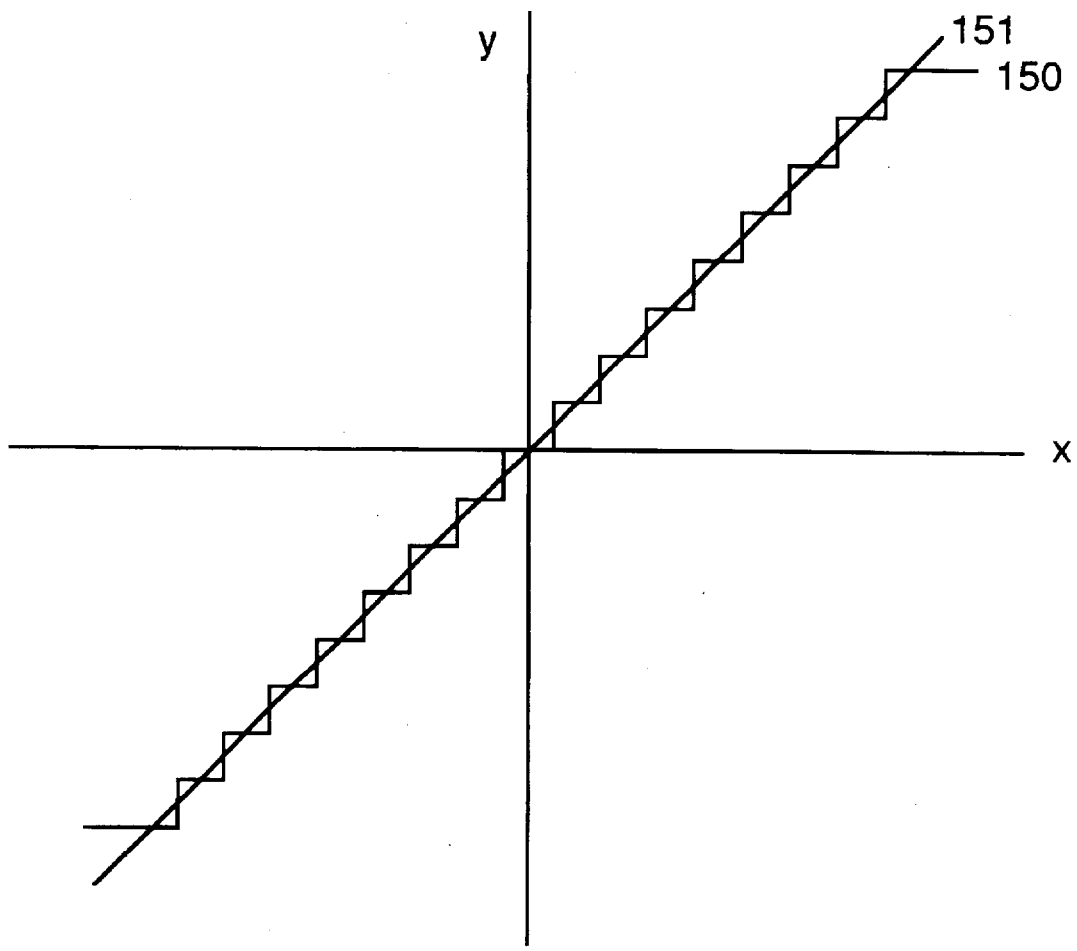
FIG. 4 (prior art) shows the transfer function of the quantizer of FIG. 2.

FIG. 4 (prior art) shows the output 150 of quantizer 30 of FIG. 2, for a given input voltage 151. Quantizer 30 has 17 evenly spaced levels, comprising, for example, −1 V, −15/16 V, −14/16 V, . . . 1 V. Thus, 16 comparators 46 and associated circuitry are required in quantizer 30. Furthermore, 17 switches and associated circuitry are required in D/A converter 33.

FIG. 5 shows the output 160 of the sparse quantizer 107 of FIG. 3 for a given input voltage 161. Quantizer 107 has five output levels. Small positive level 163 and small negative level 165 have voltages equal to 1/16 of the voltages of large positive value 167 and large negative value 169, respectively. Obviously, considerably less hardware and power is required to achieve the levels shown in FIG. 5 rather than those shown in FIG. 4.

Figure 6:
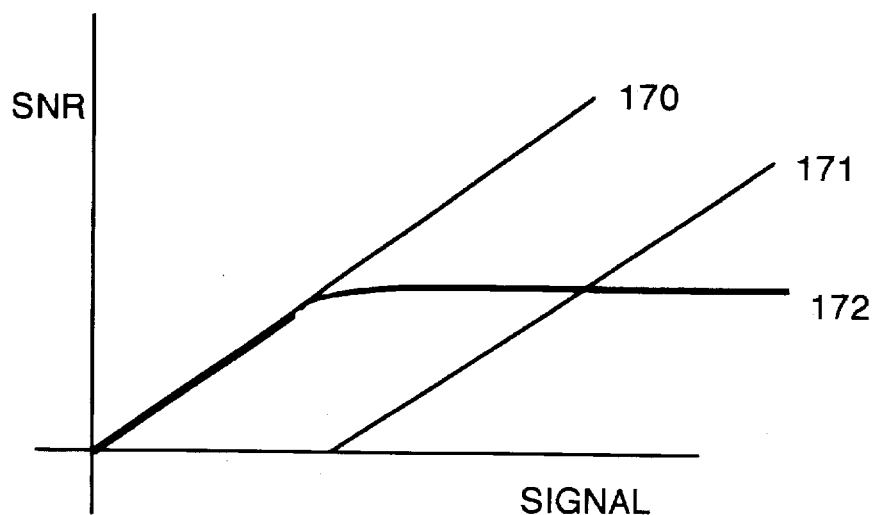
FIG. 6 shows a plot of signal to noise ratio versus signal level for the quantizer of FIG. 2 and the sparse quantizer of FIG. 4.

FIG. 6 shows a plot of approximate Signal to Noise Ratio (SNR) versus signal level for various A/D converters. Plot 170 is the SNR of a delta sigma modulator, such as the one shown in FIG. 1, utilizing evenly spaced, 17 level quantizer 30 and D/A converter 33. Plot 172 is the SNR of the FIG. 1 circuit utilizing sparse quantizer 107 and D/A converter 126. Plot 171 is the SNR of a one-bit delta sigma converter running at a high clock rate.

At low signal levels, the SNR 172 of the circuit with the sparse quantizer is equivalent to the SNR 170 of circuit with the 17 level quantizer (and better than the one-bit delta sigma converter SNR 171). Compare FIGS. 4 and 5.

Thus, the SNR of curves 170 and 172 are the same for low level signals. At higher levels, the SNR of the sparse quantizer circuit levels off, while the SNR's of the other two circuits continue to improve. However, noise is less of a concern at high signal levels. The mismatch between high and low levels is largely canceled out for high level signals, and doesn't come into play for low level signals, which only use the middle three levels of the sparse quantizer.

This lack of need for matching between high and low levels is key to the invention. It is simple to accurately match positive and negative values through use of symmetrical circuits, so an extremely tight match between the ⅛ and −⅛ levels out of the D/A is achievable. With the ratio between the low levels and high levels of 1:8, as in this example, at high signal levels much of the distortion due to the mismatch is canceled out due to the chaotic nature of the switching pattern of the converter. It is important to note that the relatively flat nature of the SNR, and the immunity to value mismatch, occurs only when the low and high levels have ratios in the range of approximately 1:3 to 1:25. It has been found that reasonable results can be achieved at a ratio of 1:8 with even 1% mismatch of the high and low levels.

Figure 7:
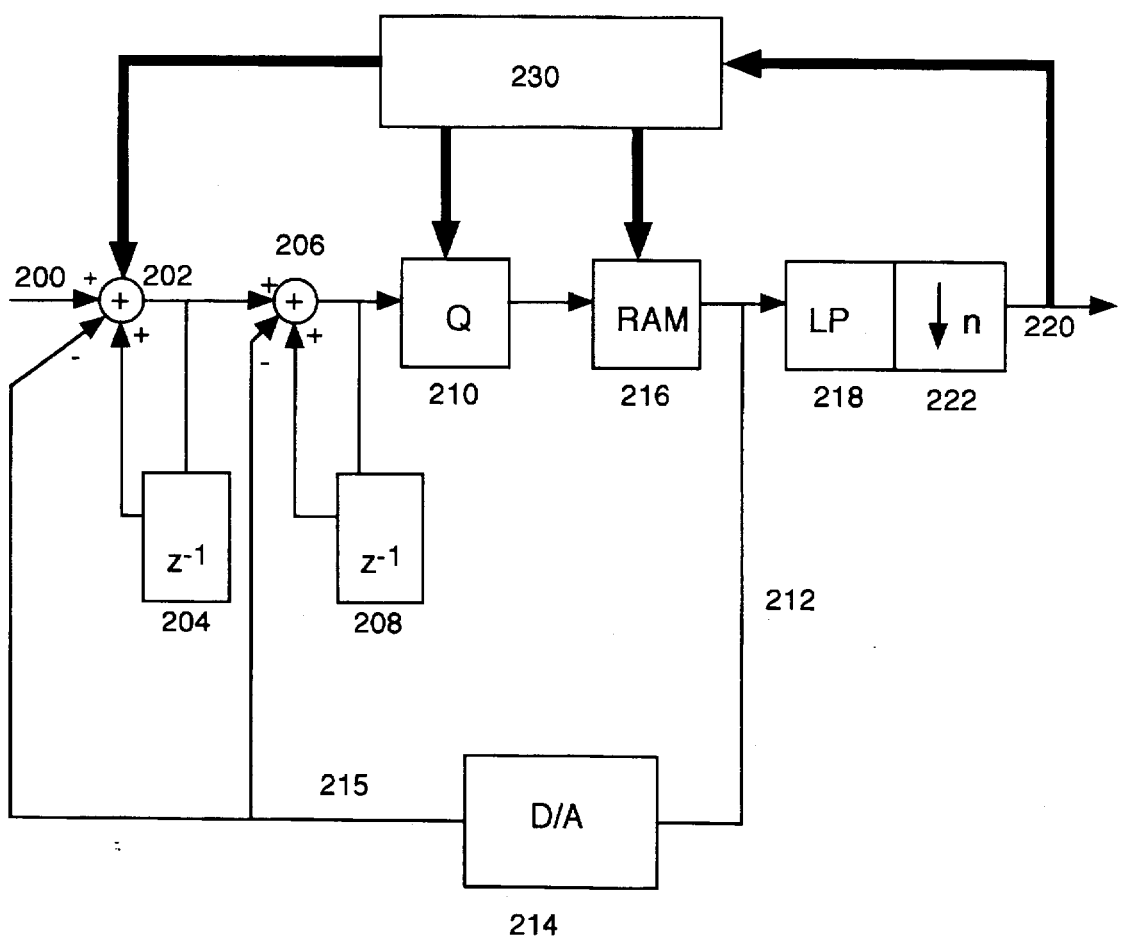
FIG. 7 shows an A/D conversion system in accordance with the present invention.

FIG. 7 shows an A/D conversion system in accordance with the present invention, including a sparse multilevel quantizer 210 (which could be quantizer 107 of FIG. 3, for example) and matching D/A converter 214 (which could be converter 126). Analog input signal 200 is added to feedback signal 215, as well as to the previous output of adder 202, delayed by delay 204. The output of adder 202 enters adder 206, where it is added to the feedback signal 215 and the previous output of adder 206, delayed by delay 208. The output of adder 206 is quantized by sparse multilevel quantizer 210, forming the digital output signal 212, as well as the input signal to D/A converter 214. D/A converter 214 converts digital signal 212 into analog feedback signal 215, which is fed into adders 202 and 206.

Digital output signal 212 is fed into correction RAM 216, which corrects for non-linearities in D/A converter 214, before the digital signal is filtered by low pass filter 218 and down converted by 222 to form digital signal 220. In the preferred embodiment, the contents of RAM 216 are selected whenever the A/D conversion system of FIG. 7 is powered on. Calibration circuit 230 controls the initialization process, as shown in FIG. 8.

A good background article generally describing the configuration of conventional digital correction circuitry is "Digitally Corrected Multi-bit Sigma Delta Data Converters," Cataltepe et. al., *IEEE Proceedings of the International Symposium on Circuits and Systems* '89, found on page 192 of the Candy and Temes reference. The present scheme is much simpler, requiring only zeroing the input and setting up simple logic.

Figure 8:
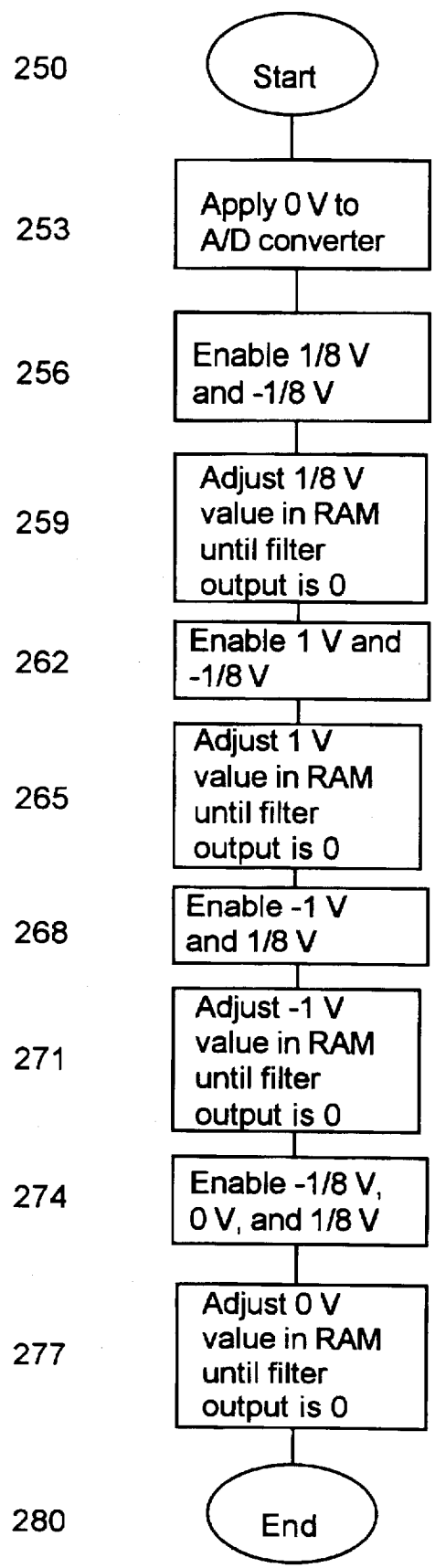
FIG. 8 is a flow diagram showing the steps for determining the values in the correction RAM of FIG. 3.

FIG. 8 is a flow diagram showing how the values in RAM 216 of FIG. 7 are selected. The steps shown in FIG. 8 are specific to the configuration of FIG. 7 wherein quantizer 210 is quantizer 107 of FIG. 3, D/A converter 214 is D/A converter 126, and the quantizer values are −1 V, −⅛ V, 0 V, ⅛ V, and 1 V. Those skilled in the art will appreciate that it would be trivial to modify the steps of FIG. 8 for different configurations and voltage levels.

The initialization process shown in FIG. 8 is preferably performed each time the A/D converter of FIG. 7 is powered up. Calibration circuitry 230 controls each step of the initialization process by directing logic block 106 (shown in FIG. 3) to output only certain voltage levels to D/A converter 126. Calibration 230 then monitors signal 220 to determine how accurate D/A converter 214 is. Next, calibration 230 adjusts the values in RAM 216 to correct for any inaccuracies. The preferred embodiment of the initialization process operates as follows.

Step 250 indicates the start of the initialization process. In step 253, calibration logic 230 provides a 0 V input to the A/D converter, in place of signal 200 (for example, by disabling signal 200 and tying the input line to ground). In step 256, calibration 230 instructs logic 106 to output on lines 108 only the +⅛ V and −⅛ V values. The circuit now functions as a single bit quantizer. If the circuitry in D/A converter 214 were perfect, then signal 220 would be exactly 0 V. In practice, the circuitry is likely to be slightly mismatched. Signal 220 might be, for example, −0.01 V rather than 0 V. In step 259, calibration 230 adjusts the value corresponding to ⅛ V in RAM 216 until signal 220 is 0 V.

In step 262, calibration 230 instructs logic 106 to allow on lines 108 only the +1 V and −⅛ V values. In step 265, calibration 230 adjusts the value corresponding to 1 V in RAM 216 until signal 220 is 0 V.

In step 268, calibration 230 instructs logic 106 to output on lines 108 only the −1 V and +⅛ V values. In step 271, calibration 230 adjusts the value corresponding to −1 V in RAM 216 until signal 220 is 0 V.

In step 274, calibration 230 instructs logic 106 to output on lines 108 only the −⅛ V, 0 V and +⅛ V portions of the output signal. In step 277, calibration 230 adjusts the value corresponding to 0 V in RAM 216 until signal 220 is 0 V. Step 280 indicates the end of initialization.

We can illustrate the configuration FIG. 7 and the flow diagram of FIG. 8 with an example. RAM 216 starts with values −1, −0.125, 0, 0.125, and 1. The actual D/A converter 214 voltages may be −1.00, −0.125, 0.01, 0.13, and 0.99. When −0.125 and 0.13 A/D converter 214 outputs are used to quantize a 0 voltage input, the −0.125 output will be used with a probability of 0.13/(0.13+0.125), or about 51% of the time. The 0.13 level will be used about 49% of the time. The output of the filter, before the RAM 216 adjustment, will be approximately (0.51 * −0.125)+(0.49 * 0.125), or 0.0025. This number is doubled (because each level is used only 50% of the time), and added to the 0.125, to get the real value, 0.13. A similar process is used to fill in the other values. After this calibration procedure the RAM values will match the A/D converter 214 voltages, in this case −1.00, −0.125, 0.01, 0.13, 0.99. One value, in this case −0.125 can be assumed to be correct, as this will only affect the overall system gain, which is not a critical parameter.

To summarize, only two or three of the quantizer levels are allowed to be used at each step of the initialization. The RAM values are adjusted at each step to compensate for non-linearities in the D/A converter by observing the output of the digital filter, and adjusting RAM 116 so that signal 220 has the appropriate value, given the input voltage.

Figure 9:
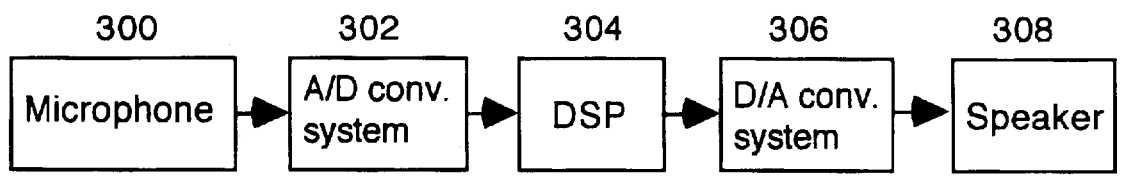
FIG. 9 shows a hearing aid which utilizes an A/D conversion system with a sparse quantizer, such as those shown in FIGS. 3 and 7.

FIG. 9 shows a hearing aid comprising a microphone 300, an A/D conversion system 302, Digital Signal Processing (DSP) 304, a D/A conversion system 306, and a speaker 308. The components of the hearing aid of FIG. 8 are conventional and well understood, except that A/D conversion system 302 has been modified in accordance with the present invention. In the preferred embodiment, A/D conversion system 302 is either the circuitry of FIG. 1, where quantizer 30 has been replaced with quantizer 107 of FIG. 3, and A/D converter 33 has been replaced with A/D converter 126 of FIG. 3, or is the circuitry of FIG. 7.

While the exemplary preferred embodiments of the present invention are described herein with particularity, those skilled in the art will appreciate various changes, additions, and applications other than those specifically mentioned, which are within the spirit of this invention.

What is claimed is:

1. In a delta sigma analog to digital (A/D) modulator having one or more integrators feeding a multilevel quantizer which provides an output signal and a feedback signal to a digital to analog (D/A) converter connected to the integrators, the improvement residing in said multilevel quantizer, comprising:

output means for providing at least four output quantizer levels including:
   means for providing a small positive level x,
   means for providing a big positive level X,
   means for providing a small negative level y, and
   means for providing a big negative level Y,
   wherein said level x and said level y have approximately equal absolute values, said level X and said level Y have approximately equal absolute values, and said level x and said level X have a ratio between about 1:3 and 1:25; and a comparator connected to the output means, said comparator having input level cutoffs spaced approximately equally between the output quantizer levels.

2. The apparatus of claim 1 wherein:
said multilevel quantizer further includes means for providing a signal level of approximately 0.

3. The apparatus of claim 2 wherein:
said D/A converter includes means for providing analog levels corresponding to the quantizer signal levels.

4. The apparatus of claim 3 wherein said level x and said level X have a ratio of about 1:8.

5. The apparatus of claim 4 wherein said A/D modulator is used as a component in a hearing aid.

6. The apparatus of claim 2 wherein:
said multilevel quantizer further includes means for providing a very small positive signal level xx and a very small negative signal level yy, said level xx and said level yy having approximately equal absolute values, and said level xx and said level x having a ratio between 1:3 and 1:25.

7. The apparatus of claim 6 wherein:
said D/A converter includes means for providing analog levels corresponding to the quantizer signal levels.

8. The apparatus of claim 7 wherein:
said level x and said level X have a ratio of about 1:8 and said level xx and said level x have a ratio of about 1:8.

9. The apparatus of claim 8 wherein said A/D modulator is used as a component in a hearing aid.

10. The apparatus of claim 1 wherein:

said D/A converter includes means for providing analog levels corresponding to the quantizer signal levels.

11. The apparatus of claim 1 wherein:

said multilevel quantizer further includes means for providing a very small positive signal level xx and a very small negative signal level yy, said level xx and said level yy having approximately equal absolute values, and said level xx and said level x having a ratio between 1:3 and 1:25.

12. The method of calibrating a correction Random Access Memory (RAM) in a delta sigma analog to digital (A/D) modulator having one or more integrators feeding a multilevel quantizer, the quantizer providing an output signal to the correction RAM which provides a corrected signal to a filter, the quantizer further providing a feedback signal to a digital to analog (D/A) converter connected to the integrators, the method comprising:

a. providing a predetermined dc input signal to the A/D modulator;

b. enabling only certain specified signal levels out of the multilevel quantizer;

c. monitoring the output of the filter;

d. adjusting the RAM value associated with at least one of the enabled quantizer signal levels until the output of the filter reaches a desired level; and e. iterating through steps (b) through (d) with different specified signal levels for each iteration, until the correction RAM is adjusted for all but one of the quantizer signal levels.

13. The method of claim 12 wherein the predetermined signal provided in step (a) represents a value of 0, the multilevel quantizer includes means for providing at least five signal levels, including a small positive level x, a big positive level X, a small negative level y, a big negative level Y, and a 0 level, wherein said level x and said level y have approximately equal absolute values, said level X and said level Y have approximately equal absolute values, and said level x and said level X have a ratio between about 1:3 and 1:25; and wherein step (e) comprises:

iterating through steps (b) through (d) four times, enabling various ones of the five signal levels for each iteration.

14. The method of claim 13 wherein step (e) further comprises:

enabling one of the following combinations of specified signal levels for each iteration;

i. small positive level x and small negative level y,
ii. big positive level X and small negative level y,
iii. big negative level Y and small positive level x,
iv. small positive level x, level 0, and small negative level y.

15. In a delta sigma analog to digital (A/D) modulator having one or more integrators feeding a multilevel quantizer which provides an output signal to a filter and a feedback signal to a digital to analog (D/A) converter connected to the integrators, the improvement comprising:

a random access memory (RAM) connected between the multilevel quantizer and the filter; and calibration circuitry for providing a predetermined input signal to the A/D modulator, iteratively enabling only certain signal levels out of the multilevel quantizer, monitoring the output of the filter, and iteratively adjusting the RAM until the output of the filter reaches a desired level for each iteration.

16. In a delta sigma analog to digital (A/D) modulator having one or more integrators feeding a multilevel quantizer which provides an output signal to a filter and a feedback signal to a digital to analog (D/A) converter connected to the integrators, the improvement comprising:

said multilevel quantizer includes means for providing at least four signal levels, including a small positive level x, a big positive level X, a small negative level y and a big negative level Y, wherein said level x and said level y have approximately equal absolute values, said level X and said level Y have approximately equal absolute values, and said level x and said level X have a ratio between about 1:3 and 1:25;

a random access memory (RAM) connected between the multilevel quantizer and the filter; and calibration circuitry for providing a predetermined input signal to the A/D modulator, iteratively enabling only certain signal levels out of the multilevel quantizer, monitoring the output of the filter, and iteratively adjusting the RAM until the output of the filter reaches a desired level for each iteration.

17. The apparatus of claim 16, wherein said quantizer further comprises a comparator connected to the means for providing, said comparator having input level cutoffs spaced approximately equally between the output quantizer levels.

* * * * *

UNITED STATES PATENT AND TRADEMARK OFFICE
CERTIFICATE OF CORRECTION

PATENT NO.      :   5,896,101
DATED           :   April 20, 1999
INVENTOR(S)     :   Melanson It is certified that errors appear in the above-identified patent and that said Letters Patent is hereby corrected as shown below:

Title page, item [56],
References Cited, Other Publications, line 2, delete "??" and insert --Z. Zhang and G.C. Temes--.

Column 1, line 38, after 'dynamic range' delete "," and insert --:--.

Column 1, line 57, after 'conventional' delete "the".

Column 2, line 21, delete "a/d" and insert --A/D--.

Column 2, line 54, delete "A/1)" and insert --A/D--.

Column 3, line 25, after 'iteration' delete ";" and insert --:--.

Column 3, line 47, delete "he" and insert --the--.

Column 4, line 11, after 'filtered by low' delete "p ass" and insert --pass--.

Signed and Sealed this

Nineteenth Day of October, 1999

Attest:

Q. TODD DICKINSON

*Attesting Officer*        *Acting Commissioner of Patents and Trademarks*